United States Patent

Guzinski

[11] Patent Number: 5,483,237
[45] Date of Patent: Jan. 9, 1996

[54] METHOD AND APPARATUS FOR TESTING A CODEC

[75] Inventor: Miroslaw Guzinski, Lawrenceville, N.J.

[73] Assignee: AT&T Corp., Murray Hill, N.J.

[21] Appl. No.: 188,879

[22] Filed: Jan. 31, 1994

[51] Int. Cl.[6] .................................................. H03M 1/10
[52] U.S. Cl. ........................................................ 341/120
[58] Field of Search ............................................. 341/120

[56] References Cited

U.S. PATENT DOCUMENTS

| | | | |
|---|---|---|---|
| 3,154,738 | 10/1964 | Greene, Jr. et al. | 341/120 |
| 3,603,772 | 9/1971 | Allen | 341/120 |
| 3,623,076 | 11/1971 | Moffitt et al. | 340/347 |
| 3,816,813 | 6/1974 | Jehu | 341/120 |
| 4,340,856 | 7/1982 | Orlandi | 341/120 |
| 4,539,683 | 9/1985 | Hahn et al. | 371/15 |
| 4,616,329 | 10/1986 | Abrams et al. | 341/120 |
| 4,805,192 | 2/1989 | Confalonieri et al. | 375/25 |
| 5,003,554 | 3/1991 | Chism | 375/10 |
| 5,132,685 | 7/1992 | DeWitt et al. | 341/120 |
| 5,214,508 | 5/1993 | Stevens | 358/139 |
| 5,305,003 | 4/1994 | Han | 341/120 |

FOREIGN PATENT DOCUMENTS

| | | | |
|---|---|---|---|
| 56-126319 | 10/1981 | Japan | 341/120 |
| 61-137429 | 6/1986 | Japan | 341/120 |

OTHER PUBLICATIONS

Havener, "Catch Missing Codes," *Electronic Design* 16, Aug. 2, 1975, pp. 58–64.

Sellier, "Analog-to-Digital Converter Automatic Tester", IBM Technical Disclosure Bulletin, vol. 22, No. 3, Aug. 1979, pp. 1–39–1040.

E. Teraoka, T. Kengaku, I. Yasui, K. Ishikawa, T. Matsuo, H. Wakada, N. Sakashita, Y. Shimazu, and T. Tokuda, Conference Proceedings International Test Conference 93 (Baltimore, Md.) Oct. 21, 1993, "A Built-In Self-Test for ADC and DAC in a Single-Chip Speech CODEC".

*Primary Examiner*—William M. Shoop, Jr.
*Assistant Examiner*—Marlon Fletcher
*Attorney, Agent, or Firm*—Robert B. Levy

[57] ABSTRACT

The testing of an n-bit encoder (14) and an n-bit decoder that collectively comprise a CODEC is performed by an apparatus including an n+1 bit counter (18) for generating a count, for generating an overflow signal once the counter has counted one beyond $2^n-1$. A digital comparator (26) is provided for comparing the count of the counter to a code generated by the encoder when the same is supplied with an input voltage. A logic circuit (24,25) is provided for sampling the counter to run freely for the purposes of testing the decoder and for enabling the counter to count each time the counter count equals the encoder code for purposes of testing the encoder.

9 Claims, 1 Drawing Sheet

METHOD AND APPARATUS FOR TESTING A CODEC

TECHNICAL FIELD

This invention relates to a technique for testing a Coder-Decoder (CODEC) to verify its performance.

BACKGROUND OF THE INVENTION

A CODEC is a device comprised of an encoder for encoding signals and a decoder for decoding signals. In practice, the encoder portion of the CODEC comprises an Analog-to-Digital (A/D) converter, and the decoder portion comprises a Digital- to-Analog (D/A) converter. CODECs are commonly used in telephony for encoding and decoding signals passing between a digital multiplexing switching and transmission system, and a subscriber loop serving a plurality of analog voice terminals.

For proper operation, the CODEC must perform signal encoding and signal decoding. Thus, complete testing a CODEC requires that operation of both the encoder and decoder portions be verified. Presently, external test equipment is often used to test the CODEC by applying an analog and a digital signal to the encoder and decoder portions, respectively, of the CODEC, causing the encoder and decoder to generate a digital code and an analog signal, respectively. The digital code and analog signal generated by the encoder and decoder, respectively, are then analyzed by the external test equipment to determine whether each portion of the CODEC was operating properly. The disadvantage of this approach is that the external test equipment employed to test the CODEC is expensive and the test time is long.

Another approach to testing a CODEC is disclosed in the paper "A Built-In Self-Test for ADC and DAC in a Single-Chip Speech CODEC" by E. Teraoka et at., presented at the International Test Conference '93 (Baltimore, Md.) on Oct. 21, 1993. In their paper, Teraoka et al. accomplish self-testing of a CODEC containing both an A/D converter and a D/A converter, as well as a Digital Signal Processor (DSP), by first down-loading blocks of digital information, representing a sinusoidal waveform, to the input of the D/A converter. The output of the D/A converter is coupled to the input of the A/D converter of the CODEC so that the A/D converter, when operating properly, should produce a digital signal corresponding to the digital signal input to the D/A converter of the CODEC. The output of the A/D converter is then analyzed by the DSP, using Fourier Transform analysis, to detect missing codes. While this scheme eliminates the need for external test equipment, the scheme is only effective if the CODEC contains a DSP. Unfortunately, not all CODECs contain such a DSP and adding a DSP simply for testing purposes would be impractical as well as expensive.

Thus, there is a need for a built-in self-test technique for testing a CODEC which overcomes the disadvantages of the prior art.

SUMMARY OF THE INVENTION

Briefly, in accordance with the invention, a method is disclosed for testing a CODEC containing an encoder portion (e.g., an A/D converter) and a decoder portion (e.g., a D/A converter). In accordance with one aspect of the invention, an input signal, which varies smoothly between 0 and V, the maximum input voltage to the encoder portion of the CODEC, is applied to the encoder to cause it to produce successive digital codes, each corresponding to the instantaneous amplitude of the input signal. Each successive digital code is compared to a count generated by an n-bit counter initially reset to a zero value. The count of the counter is also applied to the decoder portion of the CODEC to cause the decoder to generate an analog signal in accordance with the count. The input signal applied to the encoder is then compared to the output voltage produced by the decoder. If the encoder and decoder are operating properly, then the decoder should ultimately first produce a voltage as great as the maximum value of the input signal applied to the encoder portion of the CODEC and thereafter should produce a signal corresponding to the minimum value. However, if the either the decoder or encoder is faulty, then the output voltage produced by the decoder will not be equal to zero after the test is complete.

DETAILED DESCRIPTION

Figure 1:
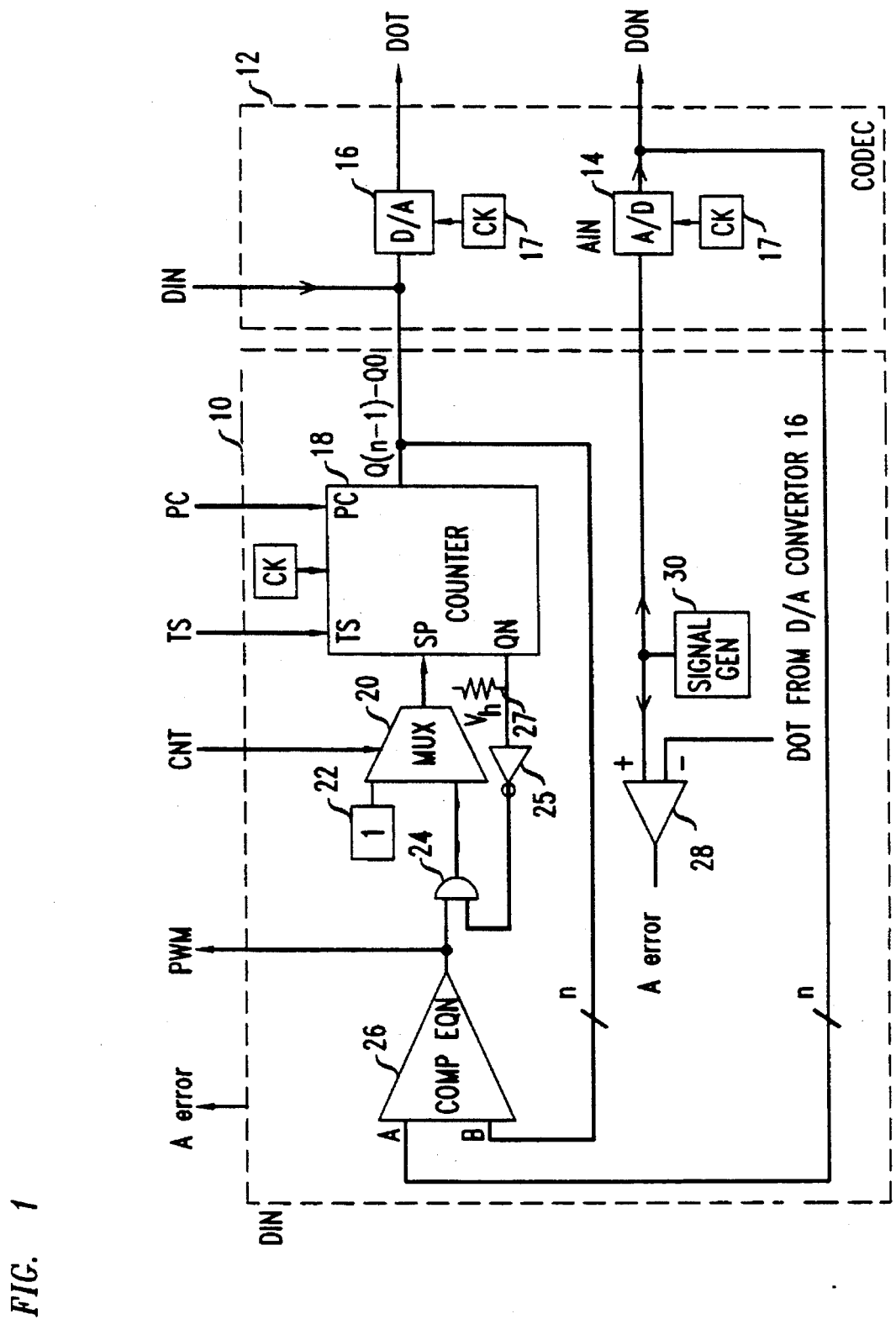
FIG. 1 is a block schematic diagram of an apparatus, in accordance with the present invention, for testing a CODEC.

FIG. 1 shows an apparatus 10, in accordance with the invention, for testing a CODEC 12 comprised of an encoder portion 14, typically an A/D converter, and a decoder portion 16, typically a D/A converter. Both the A/D converter 14 and the D/A converter 16 of the CODEC 12 are n-bit-wide devices, and are supplied from a clock 17 with a clock signal at their clock inputs. The A/D converter 14 of the CODEC 12, when operating properly, produces an n-bit-wide digital code representative of the instantaneous amplitude of an analog voltage applied to the A/D converter input. Conversely, the D/A converter 16 of the CODEC 12, when operating properly, produces an analog voltage whose amplitude corresponds to the binary value of an n-bit digital code applied to the D/A converter. A failure of either of the A/D and D/A converters 14 and 16 to properly encode and decode, respectively, the corresponding input signals applied thereto renders the CODEC 12 defective.

To accomplish testing of both the A/D and D/A converters 14 and 16 of the CODEC 12, the test apparatus 10 includes an n+1-bit-wide, sampling-type counter 18 having a Tri-State (TS) control input, a sample input (SP), a reset input (PC) as well as a clock input (CK). The counter 18 also has a set of output lines $Q_{n-1}-Q_0$ on which the counter generates a count running between 0 and $2^n-1$. In addition to the output lines $Q_{n-1}-Q_0$, the counter also has a carry line $Q_n$ on which the counter generates a logic high level bit once the counter has counted one beyond decimal $2^n-1$ (binary: 111 ... $1_n$).

The TS input to the counter 18 controls the impedance of the counter output lines $Q_{n-1}-Q_0$ and on the carry line $Q_n$. When the TS input is active high, the counter output lines and the counter carry line are high impedance thus enabling the D/A converter 16 to respond to its n−1 bit wide normal input signal DIN. The input PC controls the resetting of the counter 18. When a logic high pulse is applied to the input PC, the counter 18 is reset. The counter input SP, when high, enables the counter 18 to count monotonically each time the counter is clocked by a periodic clock signal at its input clock CK. Depending on the logic design chosen for the apparatus 10, the counter 18 will either count upward from 00 ... $0_n$ or downward from 11 ... $1_n$. Typically, the counter 18 is made to count upwards from 00 ... $0_n$. When the signal at the SP input of the counter 18 is at a logic low level, then the counter 18 no longer counts but rather continues to produce the same count as before the transition of the signal at its SP input to a logic low level.

The counter 18 has its output lines $Q_{n-1}$–$Q_0$ coupled to the input of the D/A converter 16 of the CODEC 12. If the D/A converter 16 of the CODEC 12 is operating properly, then the converter will produce a staircase output voltage DOT when supplied with successive counts from the counter 18. This assumes that the signal at the TS input of the counter is at a logic low level so that the impedance of the counter lines $Q_{n-1}$–$Q_0$ is low. The amplitude of each "stair" corresponds to the binary value of each successive count of the counter 18. Should the D/A converter 16 be defective (e.g., should the converter be unable to convert a particular count of the counter 18 into a corresponding voltage), then the waveform of the converter output voltage will be missing the "stair" corresponding to the unconverted counter count.

The counter 18 has its input SP coupled to the output of a multiplexer 20 controlled by a signal CNT that is externally applied to the apparatus 10. When the signal at the CNT input of the apparatus 10 is at a logic high level, then the multiplexer 20 passes the signal at its first input to the SP input of the counter. In the preferred embodiment, the first input of the multiplexer 20 is supplied from a signal source 22 with a continuous signal at a logic high level. Thus, for so long as the signal at the CNT input of the apparatus 10 is at logic high level, the multiplexer 20 supplies the counter 18 at its SP input with a logic high level signal, causing the counter to keep counting.

The multiplexer 20 has its second input coupled to the output of an AND gate 24 having a first input coupled to the carry line $Q_n$ of the counter 18 through an inverter 25 whose input is connected through a pull-up resistor 27 to a high voltage level $V_H$. The second input of the AND gate 24 is coupled to the output of an n-bit-wide equality digital comparator 26 having a first input (A) coupled to the output of the A/D converter 14 of the CODEC 12 and a second input (B) coupled to the lines $Q_{n-1}$–$Q_0$ of the counter 18. The equality digital comparator 26 operates to compare the count of the counter 18 to the code (DON) generated by the AFD converter 14 at its output and to generate a signal at the comparator output (EQ) at a logic high level when the counts are equal and a logic low level when they are not. Logically, the equality comparator 26 is equivalent to an n–1 bit wide exclusive NOR gate.

In addition to the digital equality comparator 26, the apparatus 10 may also be provided with an analog subtractor 28 having a first (positive) input coupled to the output DOT of the D/A converter 16 of the CODEC 12. The second (negative) input of the subtractor 28 is coupled to the output of a signal generator 30 that generates a test signal that can be made to vary smoothly from 0 to at least V volts where V exceeds the maximum input voltage to the A/D converter 14. As an example, the signal from the signal generator 14 could be a ramp signal. In addition, the output signal of the signal generator 30 serves as the input voltage (DIN) of the A/D converter 14 of the CODEC 12. While the presence of the signal generator 30 and subtractor 28 renders the test apparatus completely self-contained, these elements could be provided separately, that is external to the apparatus itself.

The apparatus 10 is operative to test the A/D converter 14 and the D/A converter of the CODEC 12 separately or together. The D/A converter 16 can be tested itself by operating the counter 18 so that it runs freely. To operate the counter 18 in this manner, the CNT signal is forced high so that the multiplexer 20 provides a logic high level signal to the SP input of the counter. At this time, the input TS of the counter 18 is forced low so that the impedance of the counter output lines $Q_{n-1}$–$Q_0$ is low, allowing the D/A converter 16 to respond to the counter count.

If the D/A converter 16 of the CODEC 12 is operating properly, then the converter should produce a staircase output voltage. A missing stair in the output voltage of the D/A converter 16 is indicative of a fault. Thus, by observing the output voltage of the D/A converter 16 on a voltage display device, such as an oscilloscope (not shown), an indication can be had as to whether the converter is operating properly. Another way to test the D/A converter 16 would be to set the signal generator 30 so as to provide a signal corresponding to the maximum output voltage of the converter when the D/A converter is supplied from the counter 18 with a count of 11 . . . $1_n$. The subtractor 28 operates to subtract the output voltage of the signal generator 30 from the output voltage of the D/A converter 16. The output voltage of the subtractor 28 ($A_{error}$) represents the analog error. Thus, if the analog error is low (within a prescribed tolerance), then the D/A converter 16 is deemed to be operating properly.

The A/D converter 14 may be tested by observing the output voltage appearing at an output PWM of the apparatus 10 (corresponding to the output EQ of the comparator 26) while the converter is being supplied with the test voltage from the signal generator 30. In response to a constant voltage from the signal generator 30, the A/D converter 14, when operating properly, will generate a digital code corresponding to that voltage. If the counter 18 is made to run freely in the manner described, then a pulse, appears at the PWM output.

The time interval between when the counter 18 began counting (from 00 . . . $0_n$ when the counter counts up) and the occurrence of the pulse is proportional to the magnitude of the voltage applied to the A/D converter 14. Thus, when examining the pulse appearing at the PWM output, it will be necessary to have some time reference to the count of the counter 18. A good reference would be the carry bit (i.e., the signal COT) appearing on the carry output line $Q_n$. Thus, the time interval between the presence of the rising edge of a pulse at the PWM output and the rising edge of a logic high COT signal is inversely proportional to the magnitude of the voltage at the input of the A/D converter 14. Rather than applying a constant voltage to the input of the A/D converter 14, a ramp voltage could be applied from the signal generator 30. Under these conditions, a stream of pulses will appear at the PWM output, each pulse corresponding to a separate code of the A/D converter. The number of pulses following resetting of the counter 18 will be $2^N-1$ for a good A/D converter 14.

Missing codes (which result from inability of the A/D converter to convert the voltages applied thereto) can be detected by the apparatus 10 in much the same way as that taught in co-pending U.S. patent application Ser. No. 08/084/855, filed in the names of M. Guzinski et al. on Jun. 30, 1993, and assigned to AT&T (herein incorporated by reference). First, the signal at the CNT input of the apparatus is forced low, so that the multiplexer 20 passes the output signal of the AND gate 24 to the SP input of the counter. Thereafter the counter 18 is reset by applying a logic high pulse to its PC input.

Under these conditions, when a slowly rising ramp signal, relative to the sampling rate of the A/D converter 14, is applied by the signal generator 30 to the A/D converter, the converter will supply the first input of the digital comparator 26 with successive digital codes. Each successive code corresponds to the amplitude of the signal generator 30 output voltage, which begins at zero and ultimately reaches V, the maximum input voltage of the A/D converter 14. The digital comparator 26 compares each code generated by the A/D converter 14 to each count of each counter 18.

Each time the count of the counter 18 equals the code generated by the digital comparator 26, the comparator generates a logic high level signal at its output. If the counter 18 has not counted one beyond decimal $2^n-1$ (binary: $111 \ldots 1_n$), then the carry bit appearing at the carry output $Q_n$ of the counter remains low, so that the output signal generated by the inverter 25 remains high. Consequently, when the EQ signal of the digital equality comparator 26 is high, and the inverter 25 output signal is high, the signal generated at the output of the AND gate 24, and applied by the multiplexer 20 to the SP input of the counter will be at a logic high level. As a result, the counter 18 increments its count by one. Thus, the counter 18 is incremented each time the code of the A/D converter 14 matches the counter 18 count, provided that the counter has not yet overflowed.

As long as the A/D converter 14 is operating properly, the converter should generate a stream of successive, monotonically increasing digital codes, each matching a corresponding one of the successively increasing counts of the counter 18. Should the A/D converter fail to produce one of its codes, then the count of the counter 18 as well as the level of the output voltage DOT of the D/A converter 16 will not change over a long time, which is indicative of a missing code. If the A/D converter 14 has produced all of its codes, then the counter 18 will be triggered to count to one beyond decimal $2^n-1$ (binary: $111 \ldots 1_n$). At this time, the signal on the lines $Q_{n-1}-Q_0$ becomes all zeros forcing DOT, which had been at its maximum level (due to the signal on the lines $Q_{n-1}-Q_0$ being all ones) to drop to zero. Note that the analog voltage which corresponds to the condition when $Q_{n-1}-Q_0$ all zeros is zero volts plus any offset pulse noise.

Once the counter 18 has counted one beyond decimal $2^n-1$ (binary: $111 \ldots 1_n$), then the carry bit appearing at the counter carry output $Q_n$ becomes a logic high level. As a result, the output of the AND gate 24 goes low, forcing the signal passed by the multiplexer 20 to SP input of the counter 18 to go low, whereupon the counter ceases to count. By monitoring the count of the counter 18, an indication can be obtained as to whether the A/D converter has generated all of its $2^n$ codes.

The apparatus 10 may advantageously be employed to test the A/D and D/A converters 14 and 16 simultaneously. To accomplish such testing, the counter 18 is reset and, thereafter, the CNT signal is held low and the counter 18 is reset. The signal generator 30 is adjusted to supply the A/D converter 14 with a slowly rising ramp signal as described previously so that the converter generates a code in accordance with the signal generator output voltage. Each code of the A/D converter 14 is compared with the current count of the counter 18. The same count of the counter 18 is also supplied to the D/A converter 16 which generates a voltage corresponding to the counter count.

Assuming that both the A/D and D/A converters 14 and 16, respectively, are operating properly, then the A/D converter should generate all of its codes, causing the counter 18 to count one beyond $2^n-1$. As a consequence, the output voltage DOT of the D/A converter 16 should change from its maximum to minimum value. Thus, the signal DOT appearing at the output of the D/A converter 16 after some period of time will be low, thus indicating proper operation of both the A/D and D/A converters 14 and 16, respectively.

The above-described technique for simultaneously testing the A/D converter 14 and the D/A converter 16 can be employed to test the pair of A/D and D/A converters in each of a plurality of CODECs 12. To accomplish such testing, the A/D converters and D/A converters would be coupled in a single daisy chain such that each A/D converter in the chain would supply its output to a downstream D/A converter.

Each D/A converter 16 and its upstream A/D converter 14 (which collectively comprise each CODEC 12 in the chain) is tested by its associated test apparatus 10 in the manner described, provided that each test apparatus is placed in a test mode by forcing the TS signal supplied to the counter 18 of each test apparatus low. As long as the A/D converter 14 and D/A converter 16 of each CODEC 12 in the chain are operating properly, then the counter 18 of the test apparatus 10 associated with the last CODEC 12 should generate a carry bit. If no carry bit is generated, then at least one CODEC 12 in the chain is defective. Which CODEC 12 is defective can be determined by examining the DOT output of the CODEC 12 associated with the test apparatus 10. If a CODEC 12 in the chain is defective, then the counter 18 of the test apparatus 10 associated with that defective CODEC will not have generated a carry bit, as indicated by the level of the COT signal.

The above-discussed approach for testing a plurality of CODECs 12 coupled in a daisy-chain affords the ability to identify which CODEC is defective. In some instances, simply knowing that chain has one or more defective CODECs 12 is sufficient. If such is the case, then it is only necessary to place the test apparatus 10 associated with the last CODEC in the chain in a test mode. If the counter 18 of the test apparatus 10 associated with the last CODEC 12 in the chain fails to generate a carry bit, then there is at least one defective CODEC in the chain.

Another approach to testing a plurality of CODECs 12 is to test each with its associated test apparatus 10 as described previously. The test results (i.e., the status of the carry bit of the counter 18 of each test apparatus 10) could then be read in parallel, or serially, with the other test apparatus to discern if any of the CODECs 12 are defective.

The foregoing describes an apparatus 10 for testing the encoder (A/I converter) 14 and decoder (D/A converter 16) of a CODEC 12. The apparatus 10 can be a stand-alone unit, or advantageously, the apparatus can be built permanently into the CODEC 12 itself or downloaded in an FPGA implementation during the test to render the CODEC self-testing.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method of testing both an n-bit encoder portion and an n-bit decoder portion of a Coder-Decoder (CODEC), comprising the steps of:

generating a binary count using an n+1 bit binary counter and generating an overflow signal once the counter has counted one beyond decimal $2^n-1$ (binary: $111 \ldots 1_n$);

applying a signal to the input of the encoder of the CODEC which varies smoothly between 0 and V volts where V exceeds a maximum encoder input voltage, to cause the encoder to generate successive, monotonic digital codes, each corresponding to the instantaneous amplitude of a continuously rising signal;

enabling the counter to change its count monotonically each time the count of the counter equals the digital code produced by the encoder;

applying the count of the counter to the decoder of the CODEC to cause the decoder to generate an analog signal that varies in accordance with the count of the counter; and comparing the input signal to the encoder of the CODEC to the output signal of the decoder to determine if both the encoder and decoder are operating properly.

2. The method according to claim 1 wherein the counter is enabled to count when the count of the counter equals the code of the encoder for as long as the counter has not counted one beyond decimal $2^n-1$ (binary: $111 \ldots 1_n$).

3. A method for testing an n-bit encoder of a Coder-Decoder (CODEC) comprising the steps of:

generating a binary count using an n+1 bit binary counter and generating an overflow signal once the counter has counted one beyond $2^n-1$;

applying a known voltage to the encoder to cause the encoder to generate a digital code corresponding to the magnitude of the applied input signal;

enabling the counter to run freely;

comparing the count of the counter by a comparator to the code generated by the encoder of the CODEC and generating a pulse at the comparator each time the encoder output code and counter count are equal;

establishing a time delay between a pulse from the comparator and an overflow signal; and determining from the time delay whether the encoder has produced a code corresponding to the voltage applied thereto.

4. The method according to claim 3 wherein the voltage applied to the encoder is a fixed voltage.

5. The method according to claim 3 wherein the voltage applied to the encoder is a ramp voltage which changes smoothly over time.

6. A method for testing an n-bit decoder of a Coder-Decoder (CODEC) comprising the steps of:

generating a binary count using an n+1 bit binary counter, initially reset to zero and generating an overflow signal once the counter has counted one beyond decimal $2^n-1$ (binary: $111 \ldots 1_n$);

enabling the counter to count freely so as to generate a monotonically changing count;

applying each count to a decoder in a successive fashion until the counter has counted one beyond decimal $2^n-1$; and determining whether the decoder has produced its maximum and then its minimum output voltage by the time the counter has counted one beyond decimal $2^n-1$.

7. Apparatus for testing an n-bit encoder and an n-bit decoder of a Coder-Decoder (CODEC) comprising:

an n+1 bit binary counter for generating a count, and for generating an overflow signal once the counter has counted one beyond decimal $2^n-1$;

a digital equality comparator for comparing the count of the counter to a code generated by the encoder and for generating a signal whose state is determined by whether the counter count equals the code generated;

logic means for logically combining the overflow signal of the counter with the output of the digital comparator to yield a first sample signal for enabling the counter to count when its count equals the code generated by the encoder; and a multiplexer for multiplexing the first enable signal with a second, continuous enable signal, so that the counter may be selectively triggered by a separate one of the first and second trigger signals.

8. The apparatus according to claim 7 further including:

signal generating means for generating a voltage for receipt by the encoder to cause the encoder, when operating properly, to generate a code in accordance with the instantaneous amplitude of the signal generator output voltage; and a subtractor for subtracting, from the output voltage generated by the decoder, the analog output voltage produced by the signal generating means when the counter is free running.

9. The apparatus according to claim 7 wherein the logic means comprises:

an inverter for inverting the overflow signal from the counter; and an AND gate for logically ANDing the inverted overflow signal with the output signal of the digital comparator to yield the first trigger signal.

* * * * *